(12) United States Patent
Futatsugi

(10) Patent No.: US 11,209,308 B2
(45) Date of Patent: Dec. 28, 2021

(54) SEMICONDUCTOR LIGHT DETECTION DEVICE AND METHOD OF DETECTING LIGHT OF SPECIFIC WAVELENGTH

(71) Applicant: ABLIC Inc., Chiba (JP)

(72) Inventor: Toshiro Futatsugi, Chiba (JP)

(73) Assignee: ABLIC INC., Chiba (JP)

( * ) Notice: Subject to any disclaimer, the term of this patent is extended or adjusted under 35 U.S.C. 154(b) by 217 days.

(21) Appl. No.: 16/146,102

(22) Filed: Sep. 28, 2018

(65) Prior Publication Data

US 2019/0103502 A1     Apr. 4, 2019

(30) Foreign Application Priority Data

Sep. 29, 2017  (JP) .............................. JP2017-191133

(51) Int. Cl.
*G01J 1/10*    (2006.01)
*G01J 1/42*    (2006.01)
(Continued)

(52) U.S. Cl.
CPC ............. *G01J 1/429* (2013.01); *G01J 1/1626* (2013.01); *G01J 1/46* (2013.01);
(Continued)

(58) Field of Classification Search
CPC .. G01J 1/1626; G01J 1/429; G01J 1/46; G01J 1/10; G01J 1/18; G01J 2001/186;
(Continued)

(56) References Cited

U.S. PATENT DOCUMENTS

| 5,130,776 A | 7/1992 | Popovic et al. |
| 9,671,288 B2 | 6/2017 | McNutt |
| | (Continued) | |

FOREIGN PATENT DOCUMENTS

| EP | 0296371 A1 | 12/1988 |
| EP | 0392442 A1 | 10/1990 |

OTHER PUBLICATIONS

Extended European Search Report in Europe Application No. 18197770.3, dated Apr. 8, 2019, 11 pages.
(Continued)

*Primary Examiner* — Edward J. Schmiedel
(74) *Attorney, Agent, or Firm* — Crowell & Moring LLP

(57) ABSTRACT

Provided is a semiconductor light detection device having a relatively high detection sensitivity to a light component of a specific wavelength. The semiconductor light detection device includes: a semiconductor light receiving element, in which a first conductive layer is formed on a surface of a semiconductor substrate, a second conductive layer is formed below the first conductive layer, a third conductive layer is formed below the second conductive layer, and a photocurrent based on the intensity of incident light is output from the third conductive layer while an input voltage is applied to the first conductive layer; and a semiconductor detection circuit configured to output an output voltage
(Continued)

based on a current difference between a first photocurrent and a second photocurrent being output in response to the application of the first input voltage and the second input voltage, respectively.

8 Claims, 12 Drawing Sheets

(51) Int. Cl.

| | | |
|---|---|---|
| H01L 31/02 | (2006.01) | |
| G01J 1/46 | (2006.01) | |
| G01J 1/16 | (2006.01) | |
| H01L 31/068 | (2012.01) | |
| G01N 21/64 | (2006.01) | |
| H01L 31/028 | (2006.01) | |
| H01L 31/103 | (2006.01) | |
| G01J 1/44 | (2006.01) | |
| H01L 31/101 | (2006.01) | |

(52) U.S. Cl.
CPC .. *H01L 31/02019* (2013.01); *G01J 2001/446* (2013.01); *G01N 21/6428* (2013.01); *H01L 31/028* (2013.01); *H01L 31/068* (2013.01); *H01L 31/103* (2013.01); *H01L 31/1013* (2013.01)

(58) Field of Classification Search
CPC ...... G01J 2001/1615; G01J 2001/1678; H01L 22/00; H01L 22/20
See application file for complete search history.

(56) References Cited

U.S. PATENT DOCUMENTS

| | | | | |
|---|---|---|---|---|
| 2001/0032921 | A1* | 10/2001 | Forsberg | G01J 1/18 250/214.1 |
| 2013/0187029 | A1* | 7/2013 | Tabuchi | G01J 1/18 250/208.2 |

OTHER PUBLICATIONS

Yhang Ricardo Sipauba Carvalho da Silva, et al., "An Ultraviolet Radiation Sensor Using Differential Spectral Response of Silicon Photodiodes", IEEE Sensors, 2015, pp. 1847-1850.

* cited by examiner

SEMICONDUCTOR LIGHT DETECTION DEVICE AND METHOD OF DETECTING LIGHT OF SPECIFIC WAVELENGTH

RELATED APPLICATIONS

This application claims priority under 35 U.S.C. § 119 to Japanese Patent Application No. 2017-191133 filed on Sep. 29, 2017, the entire content of which is hereby incorporated by reference.

BACKGROUND OF THE INVENTION

1. Field of the Invention

The present invention relates to a semiconductor light detection device and a method of detecting light of specific wavelength.

2. Description of the Related Art

Ultraviolet light included in sunlight is light components having wavelengths between 280 nm and 400 nm and commonly called UV-A (wavelength: 315 nm to 400 nm) and UV-B (wavelength: 280 nm to 315 nm). Visible light also included in sunlight and having a longer wavelength than the ultraviolet light, on the other hand, is much higher in intensity than the ultraviolet light. A semiconductor light detection device which is configured to detect the intensity of ultraviolet light included in sunlight with the influence of visible light eliminated accordingly requires a technology for reducing visible light sensitivity to a satisfactorily low level.

As semiconductor materials used to detect ultraviolet light or other light components having short wavelength, wide-gap semiconductors such as SiC and GaN are considered as promising materials. This is because a wide-gap semiconductor shows no sensitivity to visible light since the band gap is wide and consequently has an advantage that only ultraviolet light can be detected. In a semiconductor light detection device using silicon having a narrow band gap as the starting material, it is easy to integrate a semiconductor light receiving element for light detection and a semiconductor light detection circuit for processing a signal from the semiconductor light receiving element on the same substrate. Accordingly the development for the ultraviolet light detection is advancing.

In silicon, the reciprocal number of the absorption coefficient which is proportional to the absorption depth of ultraviolet light is approximately as small as 10 nm. It is therefore required to form a p-n junction at a very shallow depth when silicon is used as a semiconductor material with which ultraviolet light is detected, in order to detect a photocurrent base on carriers generated near a surface of the silicon by the absorption of ultraviolet light and in order to suppress the absorption of other long-wavelength light.

For example, in Yhang Ricardo Sipauba Carvalho da Silva, Yasumasa Koda, Satoshi Nasuno, Rihito Kuroda, and Shigetoshi Sugawa, "An Ultraviolet Radiation Sensor Using Differential Spectral Response of Silicon Photodiodes", IEEE SENSORS, 2015, pp. 1847-1850, detection technology for an ultraviolet light is disclosed in which the first silicon photodiode enhanced in ultraviolet light sensitivity by forming a p-n junction at a shallow depth and the second silicon photodiode reduced in ultraviolet light sensitivity on a surface of silicon are fabricated, and visible light components are reduced by utilizing the fact that the two photodiodes have the same sensitivity to visible light components acquired in a deep region of the silicon and by obtaining the difference between the photocurrents of the photodiodes.

With the silicon photodiode in Yhang Ricardo Sipauba Carvalho da Silva et al., however, there is difficulty in reducing a visible light component in a wavelength range of 400 nm to 500 nm as illustrated in FIG. 7 thereof, and it is hard to detect ultraviolet light components at a high sensitivity relative to visible light sensitivity.

The reason is that a p-n junction cannot be formed in an extraordinarily shallow region since the p-n junction in which a photocurrent is generated includes at least a semiconductor surface layer and a part of a semiconductor buried layer, thereby causing a difficulty in suppressing the influence of light components longer in wavelength than ultraviolet light.

SUMMARY OF THE INVENTION

Provided is a semiconductor light detection device relatively enhanced in sensitivity to light components of specific wavelengths, including ultraviolet light, and capable of suppressing sensitivity to light components of other wavelengths.

A semiconductor device according to one embodiment of the present invention is configured as described below.

That is, there is provided a semiconductor light detection device, including: a semiconductor light receiving element including a first conductive layer on a surface of a semiconductor substrate, and having a first conductivity type, a second conductive layer below the first conductive layer, and having a second conductivity type, and a third conductive layer below the second conductive layer, and having the first conductivity type, and configured to: output, from the third conductive layer, a first photocurrent based on an intensity of an incident light irradiating the first conductive layer from above, while a first input voltage is applied to the first conductive layer; and output, from the third conductive layer, a second photocurrent based on the intensity of the incident light irradiating the first conductive layer from above, while a second input voltage is applied to the first conductive layer; and a semiconductor light detection circuit configured to output an output voltage based on a current difference between the first photocurrent and the second photocurrent.

According to one embodiment of the present invention, in the semiconductor light receiving element including the first conductive layer which is formed on the semiconductor substrate, the second conductive layer below the first conductive layer, and the third conductive layer below the second conductive layer, a part of high energy carriers generated by the absorption of short-wavelength light in the first conductive layer which is the topmost surface can reach the third conductive layer and can be detected as a photocurrent. This ensures that a light component of a specific wavelength is detected without placing a p-n junction of the first conductive layer and the second conductive layer in an extraordinarily shallow region. The resultant semiconductor light detection device consequently has a relatively enhanced sensitivity to light components of specific wavelengths, including ultraviolet light, and is capable of suppressing sensitivity to light components of other wavelengths.

DETAILED DESCRIPTION OF THE PREFERRED EMBODIMENTS

Now, embodiments of the present invention are described in detail with reference to the drawings.

A semiconductor light receiving element used in embodiments of the present invention, and a detection method for detecting a specific wavelength with the use of the semiconductor light receiving element, are described first.

Figure 1:
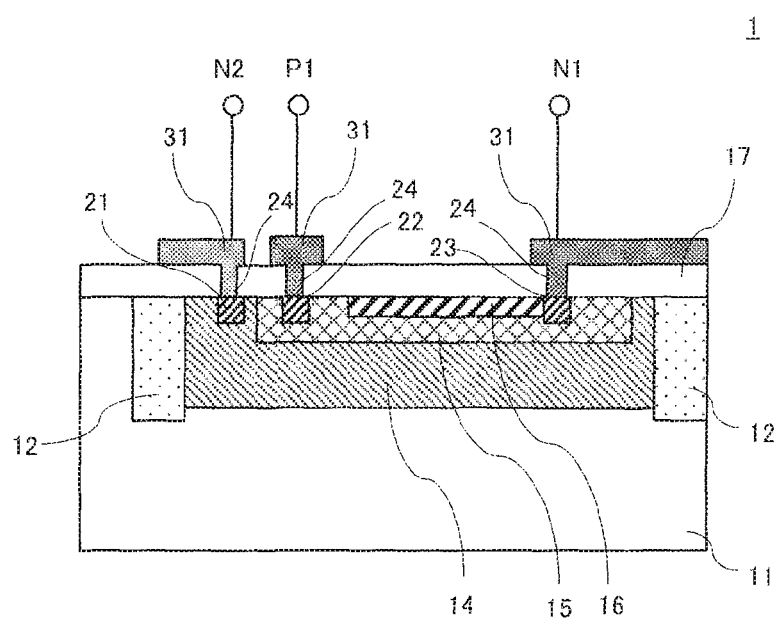
FIG. 1 is a sectional view for illustrating the structure of a semiconductor light receiving element in embodiments of the present invention.

FIG. 1 is a sectional view for illustrating the semiconductor light receiving element used in the embodiments of the present invention. A semiconductor light receiving element 1 of FIG. 1 includes, in a region on a surface of a p-type silicon substrate 11, surrounded by an element isolation region 12 which is a shallow trench isolation (STI) region or the like, an n-type first conductive layer 16, a p-type second conductive layer 15 below the first conductive layer 16, and an n-type third conductive layer 14 below the second conductive layer 15. The conductive layers are layered in a depth direction from the surface of the p-type silicon substrate 11. High energy carriers are generated by the absorption of short-wavelength light in the first conductive layer 16 which is the topmost surface. A part of the generated carriers which reaches the third conductive layer 14 is detected as photocurrent. An $n^+$ diffusion layer 23, a $p^+$ diffusion layer 22, and an $n^+$ diffusion layer 21 are formed in the first conductive layer 16, the second conductive layer 15, and the third conductive layer 14, respectively. An insulating layer 17 made of a silicon oxide film or the like is formed on the p-type silicon substrate 11. Contact holes 24 are formed in portions of the insulating layer 17 that are above the $n^+$ diffusion layer 23, the $p^+$ diffusion layer 22, and the $n^+$ diffusion layer 21 to connect the diffusion layers 23, 22, and 21 through metal wiring 31 to a first conductive layer terminal N1, a second conductive layer terminal P1, and a third conductive layer terminal N2, respectively.

A description is given next on a method of detecting ultraviolet light components which have specific wavelengths in sunlight with the use of the semiconductor light receiving element 1 of FIG. 1.

First, 0 V is applied to the second conductive layer terminal P1 while sunlight enters the semiconductor light receiving element 1 of FIG. 1 from above. A voltage of 0.3 V is also applied to the third conductive layer terminal N2 as a reverse voltage of a p-n junction with respect to the voltage of the second conductive layer terminal P1. A voltage of 0.8 V is then applied so that a first voltage applied to the first conductive layer terminal N1 (a voltage applied to the first conductive layer terminal N1 is hereinafter denoted by Vsn) is a reverse voltage of the p-n junction with respect to the voltage of the second conductive layer terminal P1, and a first photocurrent Iphr flowing in the third conductive layer 14 is detected at the third conductive layer terminal N2. The first photocurrent Iphr is generated in a p-n junction region between the p-type second conductive layer 15 and the n-type third conductive layer 14 and in a p-n junction region between the n-type third conductive layer 14 and the p-type silicon substrate 11, and is generated mainly by long-wavelength light components of the sunlight.

Next, with the sunlight still entering the semiconductor light receiving element 1 from above, the same voltages as before are applied to the second conductive layer terminal P1 and the third conductive layer terminal N2, −0.2 V which is a small forward voltage of the p-n junction with respect to the voltage of the second conductive layer terminal P1 is applied as a second voltage of the voltage Vsn applied to the first conductive layer terminal N1, and a second photocurrent Iphf flowing in the third conductive layer 14 is detected at the third conductive layer terminal N2. The second photocurrent Iphf includes, in addition to a photocurrent that is generated by long-wavelength light components out of sunlight components similarly to Iphr, a photocurrent that is generated by short-wavelength light components including ultraviolet light, as described later. The second voltage of Vsn is set to a small voltage having an absolute value of 0.4 volt or less and having a forward direction with respect to the voltage of the second conductive layer terminal P1 in order to take out only the photocurrent by suppressing a forward current that flows in a p-n junction region between the first conductive layer 16 and the second conductive layer 15.

Through the detection of a difference between the first photocurrent Iphr and the second photocurrent Iphf, visible light components which are originated from carriers generated in places other than the first conductive layer 16 are removed and a photocurrent can be obtained having a relatively high sensitivity to ultraviolet light.

A description given next is a mechanism enabling the semiconductor light receiving element 1 to detect ultraviolet light at a high sensitivity relative to visible light sensitivity by the method described above.

Ultraviolet light entering the semiconductor light receiving element 1 of FIG. 1 from above is absorbed in a shallow region located at a depth of 10 nm or so from the silicon surface, thereby generating electron-hole pairs in the first conductive layer 16. Since the resultant photocurrent flows into the second conductive layer 15 and the first conductive layer 16, it is commonly considered that no photocurrent is generated from ultraviolet light in the third conductive layer 14. However, the inventor of the present invention has found out that, depending on the voltage condition, some of the carriers generated in the first conductive layer 16 by the absorption of ultraviolet light reach the third conductive layer 14 to be detected as a photocurrent.

Figure 2A:
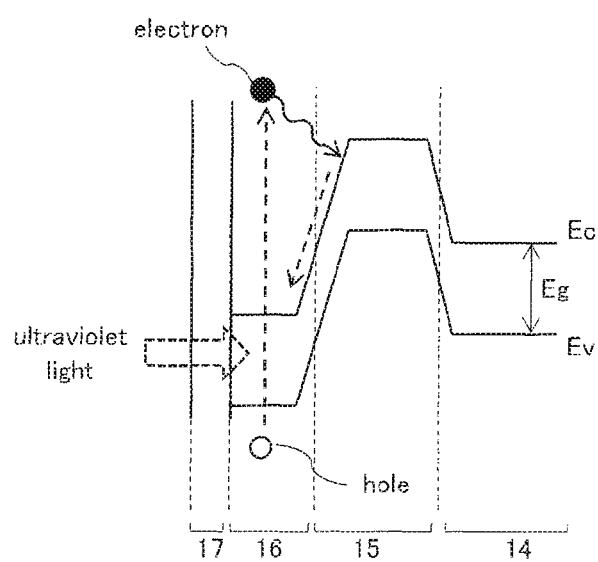
FIG. 2A is a diagram of an energy band under a specific bias condition when ultraviolet light enters the semiconductor light receiving element in the embodiments of the present invention.
Figure 2B:
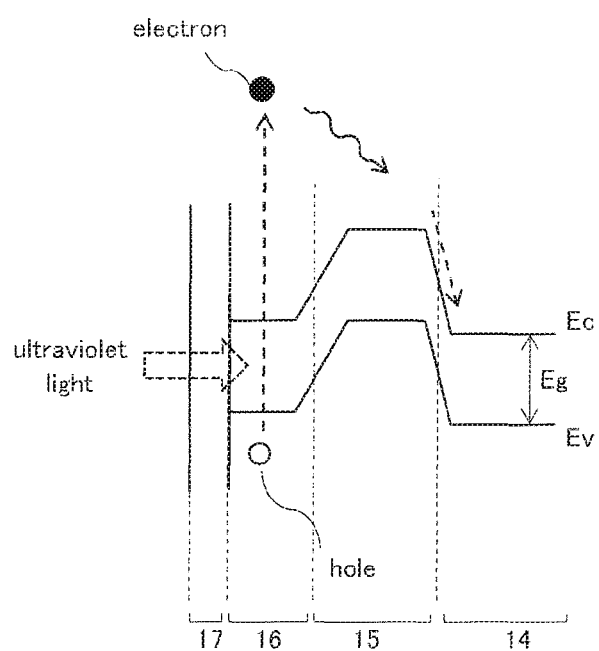
FIG. 2B is a diagram of an energy band under another specific bias condition when ultraviolet light enters the semiconductor light receiving element in the embodiments of the present invention.

FIG. 2A and FIG. 2B are schematic diagrams of an energy band from the insulating layer 17 on the surface of the semiconductor light receiving element 1 to the third conductive layer 14. An energy level at a lower end of a conduction band is denoted by Ec, an energy level at an upper end of a valence band is denoted by Ev, a band gap energy is denoted by Eg, and Ec, Ev, and Eg satisfy Eg=Ec−Ev. The incidence of ultraviolet light on this semiconductor light receiving element 1 generates electron-hole pairs in the first conductive layer 16. When the incident ultraviolet light has a wavelength of 300 nm, for example, the photon energy of the ultraviolet light is 4.13 eV as shown in Table 1, and is far larger than the band gap energy Eg of silicon which is 1.12 eV. Many electrons in the first conductive layer 16 are accordingly excited from the valence band to the conduction band, and further acquire energy large enough to overpass the energy barrier in the p-n junction region between the first conductive layer 16 and the second conductive layer 15.

TABLE 1

Relation between light wavelength and energy

| Light wavelength [nm] | Energy [eV] |
|---|---|
| 200 | 6.20 |
| 300 | 4.13 |
| 400 | 3.10 |
| 1,107 | 1.12 |

FIG. 2A is a diagram of an energy band when a reverse voltage of approximately 1 V is applied between the first conductive layer 16 and the second conductive layer 15. An electron excited by the ultraviolet light absorption in the first conductive layer 16 as indicated by the upward dotted-line arrow acquires high energy. However, only a few electrons are capable of overpassing the energy barrier in the p-n junction region between the first conductive layer 16 and the second conductive layer 15 due to energy relaxation as indicated by the solid-line arrow.

FIG. 2B, on the other hand, is a diagram of an energy band when a small forward voltage around 0.2 V is applied between the first conductive layer 16 and the second conductive layer 15. In this case an electron excited by the ultraviolet light absorption in the first conductive layer 16 as indicated by the upward dotted-line arrow has energy even higher to the energy barrier than in FIG. 2A. The probability of an electron overpassing the energy barrier in the p-n junction region between the first conductive layer 16 and the second conductive layer 15 and reaching the p-n junction region between the second conductive layer 15 and the third conductive layer 14 as indicated by the solid-line arrow is accordingly high. Flow of the electrons into the third conductive layer 14 caused by the electric field in this p-n junction region becomes a photocurrent corresponding to the intensity of the ultraviolet light.

The probability at which an electron excited by the ultraviolet light overpasses the energy barrier between the first conductive layer 16 and the second conductive layer 15 and turns into a photocurrent flowing into the third conductive layer 14 thus depends on the magnitude of the voltage applied to the p-n junction between the first conductive layer 16 and the second conductive layer 15. When the incident light contains components having a wide range of wavelengths as in the case of sunlight, a photocurrent flowing in the third conductive layer 14 additionally includes, however, a photocurrent generated from visible light components or other long-wavelength light components in the p-n junction between the second conductive layer 15 and the third conductive layer 14 and the p-n junction between the third conductive layer 14 and the p-type silicon substrate 11. The photocurrent generated in those p-n junctions, however, is independent of the voltage applied between the first conductive layer 16 and the second conductive layer 15.

Only a photocurrent based on ultraviolet light can accordingly be taken out while eliminating the influence of visible light, by changing the voltage applied to the first conductive layer 16, measuring photocurrents that flow in the third conductive layer 14 with respect to each applied voltage, and obtaining the difference between the measured photocurrents.

The small forward voltage applied between the first conductive layer 16 and the second conductive layer 15 has desirably an absolute value of 0.4 volt or less as described above. This is because the forward current caused by the diffusion phenomenon increases exponentially when the applied voltage exceeds 0.4 V, making the detecting of a change in photocurrent difficult.

A semiconductor material desired to detect light of a specific wavelength utilizing this mechanism is a material having a band gap that is sufficiently smaller than the energy of the specific wavelength. In the case of ultraviolet light having an energy of 4.13 eV, for example, silicon having an energy gap of 1.12 eV and germanium having an energy gap of 0.67 eV are desirable materials. A compound semiconductor material may also be used as long as the material has the same level of energy gap.

Figure 3:
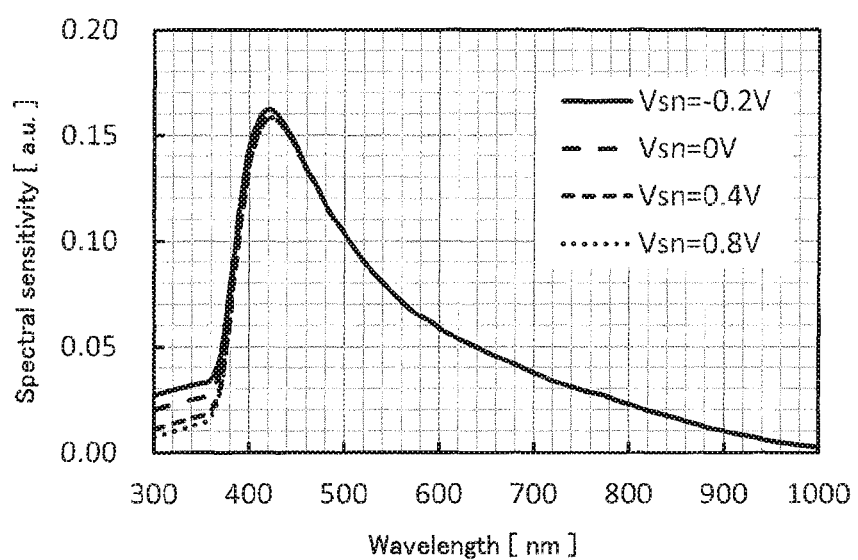
FIG. 3 is a graph for showing spectral sensitivity characteristics in a semiconductor light detection element according to embodiments of the present invention.

FIG. 3 is a graph of spectral sensitivity characteristics calculated from a photocurrent that is taken out of the third conductive layer 14 of the semiconductor light receiving element 1. Bias condition in this case includes setting the voltage that is applied to the p-type silicon substrate 11 and the voltage that is applied to the second conductive layer 15 to 0 V, setting the voltage that is applied to the third conductive layer 14 to 0.3 V, and changing the voltage Vsn which is a voltage applied to the n-type first conductive layer 16 within a range of −0.2 V to 0.8 V. A change in Vsn varies the spectral sensitivity characteristics in a light wavelength range of 300 nm to 450 nm. The change is particularly noticeable in an ultraviolet wavelength range of 400 nm or less. The setting of Vsn to 0.8 V is a condition that biases the p-n junction between the first conductive layer 16 and the second conductive layer 15 most in the reverse direction, and sensitivity to light components having wavelengths in the ultraviolet range is lowest under this condition. The setting of the voltage applied to the first conductive layer 16 to −0.2 V, on the other hand, is a condition that biases the p-n junction between the first conductive layer 16 and the second conductive layer 15 in the forward direction to the extent that the forward current is negligible, and sensitivity to light components having wavelengths in the ultraviolet range is highest under this condition. The spectral sensitivity characteristics in the light wavelength range of 300 nm to 450 nm vary depending on the magnitude of Vsn in this manner. Spectral sensitivity characteristic at a light wavelength of 450 nm or higher, on the other hand, depends very little on the magnitude of Vsn as shown in FIG. 3.

Figure 4:
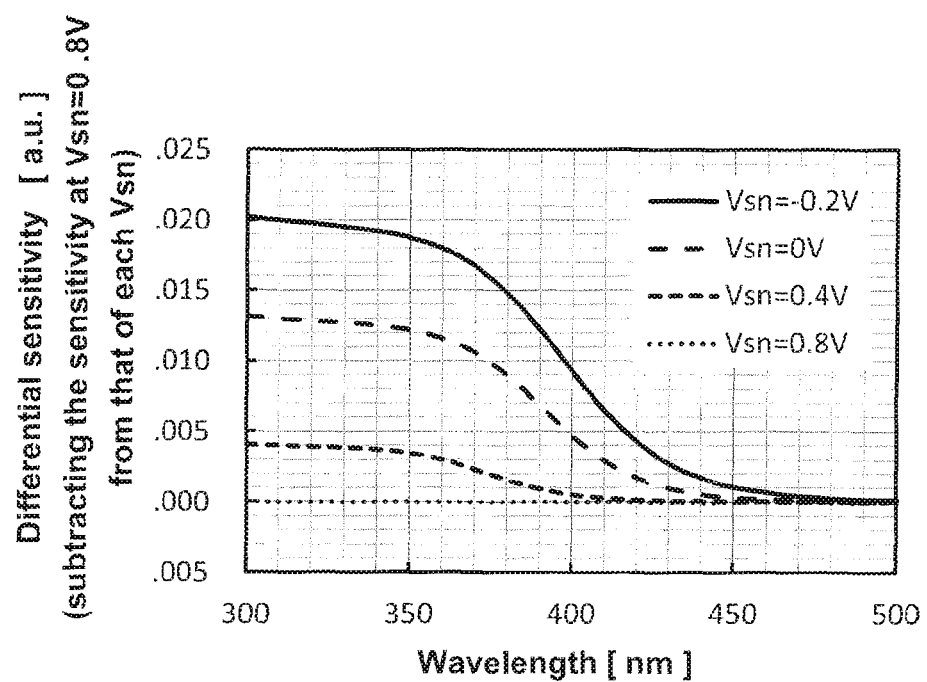
FIG. 4 is a graph for showing differential sensitivity characteristics obtained by subtracting a spectral sensitivity characteristic at Vsn=0.8 V in the semiconductor light detection element according to embodiments of the present invention.

FIG. 4 is a graph of differential sensitivity characteristics in which a differential from spectral sensitivity characteristic at Vsn=0.8 V is obtained for each of spectral sensitivity characteristics when Vsn is set to −0.2 V, 0 V, 0.4 V, and 0.8 V, and is drawn with respect to the wavelength of light for comparison. The differential sensitivity is zero in a visible light wavelength range of 500 nm or higher, and is also lower than that of the light detection device of the related art which uses silicon in a wavelength range of 400 nm to 500 nm.

A description is given on a semiconductor light detection device according to an embodiment of the present invention which includes the semiconductor light receiving element described above and a semiconductor light detection circuit using the semiconductor light receiving element to detect light components of specific wavelengths.

Figure 5A:
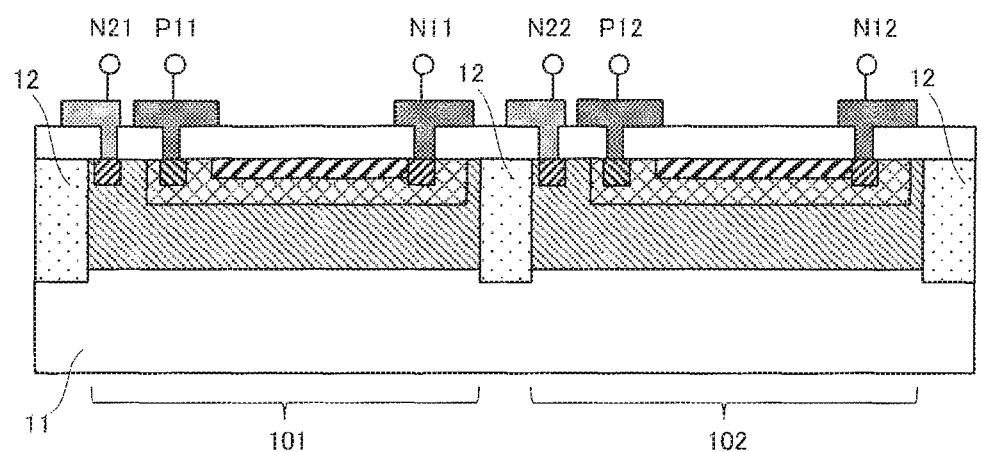
FIG. 5A is a sectional view for illustrating the structure of a semiconductor light receiving elements according to the first embodiment of the present invention.
Figure 5B:
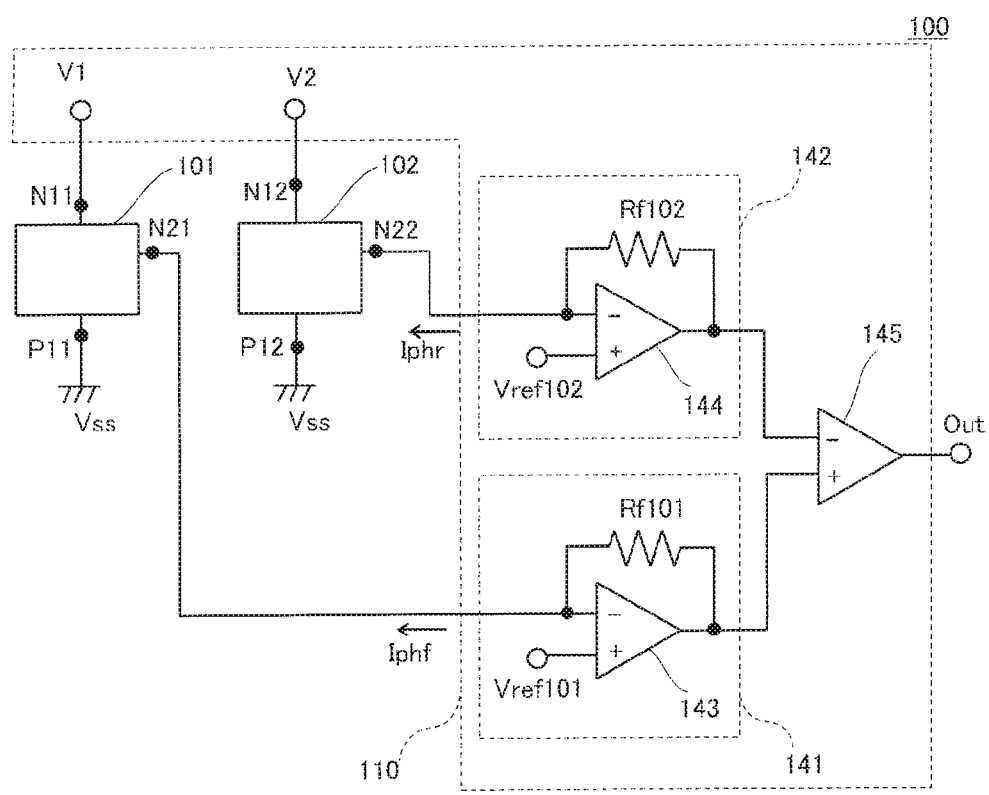
FIG. 5B is a schematic diagram for illustrating the configuration of the semiconductor light detection device according to the first embodiment of the present invention.

FIG. 5A is a sectional view of semiconductor light receiving elements 101 and 102 in the first embodiment of a semiconductor light detection device. FIG. 5B is a schematic diagram of a semiconductor light detection device 100 according to the first embodiment in which the semiconductor light receiving elements 101 and 102 are combined with a semiconductor light detection circuit 110.

In the semiconductor light detection device according to the first embodiment, the semiconductor light receiving element 101 and the semiconductor light receiving element 102 which have the structure of FIG. 1 described above are provided adjacent to each other, with the element isolation region 12 interposed between the two, on the p-type silicon substrate 11 as illustrated in FIG. 5A. The semiconductor light receiving element 101 includes a first conductive layer terminal N11, a second conductive layer terminal P11, and a third conductive layer terminal N21. The semiconductor light receiving element 102 includes a first conductive layer terminal N12, a second conductive layer terminal P12, and a third conductive layer terminal N22.

As illustrated in FIG. 5B, a constant voltage V1 is supplied from a constant voltage circuit to the first conductive layer terminal N11 of the semiconductor light receiving element 101. By setting the constant voltage V1 which is applied to the first conductive layer terminal N11 to 0.4 V, for example, the incidence of light on the semiconductor light receiving element 101 from above causes output of the photocurrent Iphf from the third conductive layer terminal N21 having the spectral sensitivity at a bias condition Vsn=0.4 V shown in FIG. 3. The second conductive layer terminal P11 in this case is connected to a Vss terminal which has the lowest electric potential in the circuit.

The first conductive layer terminal N12 of the semiconductor light receiving element 102, on the other hand, receives input of a constant voltage V2 which differs from V1. By setting the constant voltage V2 which is applied to the first conductive layer terminal N12 to 0.8 V, for example, the incidence of light on the semiconductor light receiving element 102 from above causes output of the photocurrent Iphr from the third conductive layer terminal N22 having the spectral sensitivity at a bias condition Vsn=0.8 V shown in FIG. 3. The second conductive layer terminal P12 in this case is connected to the Vss terminal which has the lowest electric potential in the circuit.

The semiconductor light detection circuit 110 converts ultraviolet light components in incident light into an output voltage based on the intensity of the ultraviolet light, by referring to the photocurrents Iphf and Iphr which are output from the semiconductor light receiving elements 101 and 102, and provides the output voltage from an Out terminal.

A current-voltage conversion circuit 141 converts the photocurrent Iphf which is supplied from the semiconductor light receiving element 101 to an inverting input terminal of a differential amplifier 143, into a voltage based on the product of the value of the photocurrent Iphf and the resistance value of a resistor Rf101, and provides the voltage to a differential amplification circuit 145 (hereinafter the quotient of a voltage output from a current-voltage conversion circuit divided by a current input to the current-voltage conversion circuit is referred to as "current-voltage conversion ratio"). A constant voltage Vref101 of 0.3 V, for example, is applied to a non-inverting input terminal of the differential amplifier 143. The voltage of the third conductive layer terminal N21 of the semiconductor light receiving element 101 is consequently fixed to Vref101.

A current-voltage conversion circuit 142 converts the photocurrent Iphr, which is supplied from the semiconductor light receiving element 102 to an inverting input terminal of a differential amplifier 144, into a voltage based on the product of the value of the photocurrent Iphr and the resistance value of a resistor Rf102, and provides the voltage to the differential amplification circuit 145. A constant voltage Vref102 of 0.3 V, for example, is applied to a non-inverting input terminal of the differential amplifier 144. The voltage of the third conductive layer terminal N22 of the semiconductor light receiving element 102 is consequently fixed to Vref102.

Voltages output from the current-voltage conversion circuits 141 and 142 are compared in the differential amplifier circuit 145, and an output voltage based on a voltage difference between the compared voltages is supplied from an Out terminal.

Through the circuit operation described above, an output voltage based on a photocurrent of short-wavelength components can be obtained in which the photocurrent Iphr which is output from the third conductive layer terminal N22 of the semiconductor light receiving element 102 and which includes long-wavelength components is removed from the photocurrent Iphf which is output from the third conductive layer terminal N21 of the semiconductor light receiving element 101 and which includes short-wavelength components and long-wavelength components. The output voltage can be obtained at a relatively high sensitivity to light components having a wavelength of 400 nm or less while differential sensitivity is lowered in a wavelength range of 400 nm to 500 nm as indicated in FIG. 4 by the characteristic at the bias condition Vsn=0.4 V.

The current-voltage conversion circuits 141 and 142 each of which includes a differential amplifier, a resistor, and others in the first embodiment are not limited to this configuration as long as the same function is implemented. The differential amplification circuit 145 can also be a circuit of various configurations as long as the circuit compares input voltages and outputs a signal based on a voltage difference between the input voltages. For instance, a circuit can be applicable in which a comparator or a similar circuit are used to compare input signal magnitudes to output presence or absence of a short-wavelength light in a digital signal, or a circuit in which a resistor and a plurality of differential amplifiers are combined to implement an analog signal output function may be used.

Figure 6A:
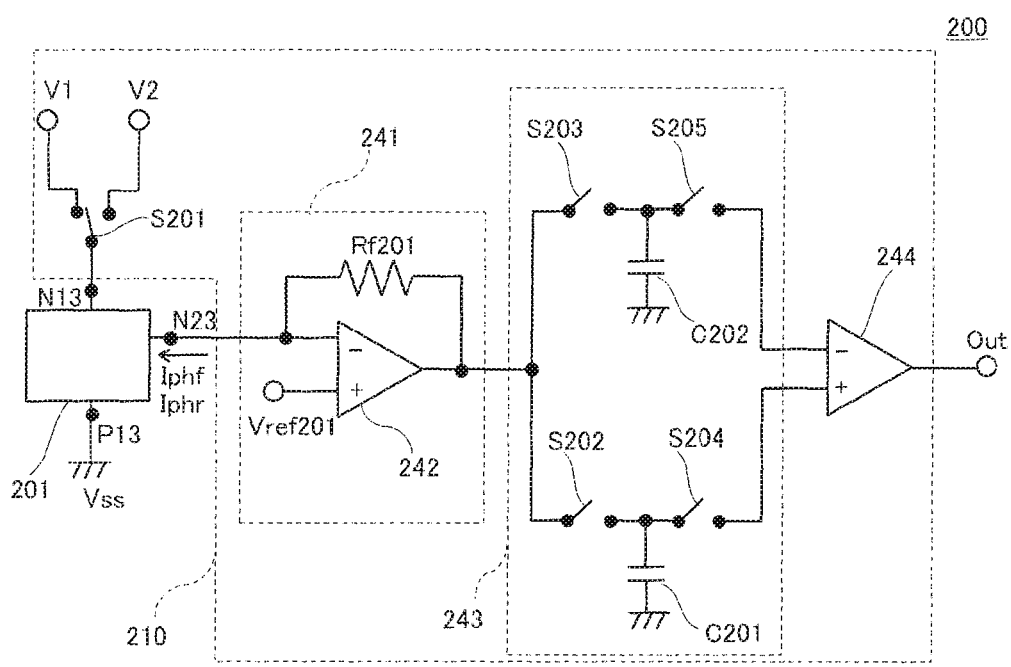
FIG. 6A is a schematic diagram for illustrating the configuration of a semiconductor light detection device according to the second embodiment of the present invention.

FIG. 6A shows the second embodiment of the present invention in the form of a schematic diagram of a semiconductor light detection device 200 in which a semiconductor light receiving element 201 similar to the element of FIG. 1 is combined with a semiconductor light detection circuit 210. The semiconductor light receiving element 201 illustrated in FIG. 6A has the same structure as that of the semiconductor light receiving element 1 illustrated in FIG. 1. A first conductive layer terminal N13, a second conductive layer terminal P13, and a third conductive layer terminal N23 of FIG. 6A correspond to the terminals N1, P1, and N2, respectively, of FIG. 1.

The semiconductor light detection device for detecting light components of specific wavelengths according to the second embodiment of the present invention uses only one semiconductor light receiving element, whereas two semiconductor light receiving elements are used in the first embodiment. In the semiconductor light receiving element 201 in the semiconductor light detection device 200 according to the second embodiment shown by FIG. 6A, incident light causes to output the photocurrent Iphf in a first period and the photocurrent Iphr in a second period. The semiconductor light detection circuit 210 outputs, from an Out terminal, an output voltage based on the intensity of the ultraviolet light by referring to the two photocurrents Iphf and Iphr.

The semiconductor light receiving element 201 includes the first conductive layer terminal N13, the second conductive layer terminal P13, and the third conductive layer terminal N23. One of the two constant voltages V1 and V2 is selected to input to the first conductive layer terminal N13 of the semiconductor light receiving element 201 via a switch S201. The second conductive layer terminal P13 in this case is connected to the Vss terminal which has the lowest electric potential in the circuit.

A current-voltage conversion circuit 241 includes a differential amplifier 242 and a resistor Rf201, and converts an input current into a voltage for output based on the product of the value of the input current and the resistance value of the resistor Rf201.

A voltage storage circuit 243 includes capacitors C201 and C202 and switches S202, S203, S204, and S205. The voltage storage circuit 243 separately stores different voltages supplied in an arbitrary period in the capacitors C201 and C202, and then outputs the stored voltages.

Figure 6B:
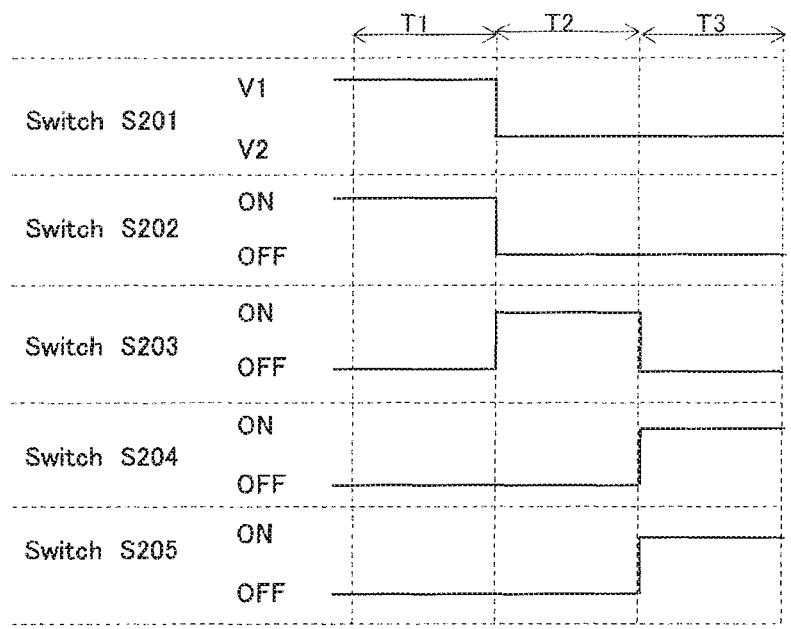
FIG. 6B is a timing chart of signal processing in a semiconductor light detection circuit according to the second embodiment of the present invention.

A light detection method using the semiconductor light detection device 200 according to the second embodiment is described with reference to a timing chart of FIG. 6B.

In the first period T1, the switch S201 is connected to a terminal side to which the constant voltage V1 from a constant voltage circuit or the like is supplied, and thus the constant voltage V1 is applied to the first conductive layer terminal N13 of the semiconductor light receiving element 201. By setting V1 to, for example, 0.4 V in this period, the incidence of light on the semiconductor light receiving element 201 from above causes output of the photocurrent Iphf from the third conductive layer terminal N23 having the spectral sensitivity at the bias condition Vsn=0.4 V in FIG. 3. Output of the photocurrent Iphf from the semiconductor light receiving element 201 is supplied to an inverting input terminal of the differential amplifier 242 which is included in the current-voltage conversion circuit 241, and is converted into a voltage based on the product of the value of the photocurrent Iphf and the resistance value of the resistor Rf201. The voltage obtained by the conversion is output to the voltage storage circuit 243. A constant voltage Vref201 of 0.3 V, for example, is applied to a non-inverting input terminal of the differential amplifier 242. The voltage of the third conductive layer terminal N23 of the semiconductor light receiving element 201 is consequently fixed to Vref201.

The voltage output from the current-voltage conversion circuit 241 in the first period T1 is stored in the capacitor C201 of the voltage storage circuit 243. To achieve this, in the first period T1, an output terminal of the current-voltage conversion circuit 241 is connected to only one of the terminals of the capacitor C201 by switching on the switch S202 of the voltage storage circuit 243 and switching off the other switches S203, S204, and S205.

Subsequently, in the second period T2, the switch S201 is connected to a terminal side to which the constant voltage V2 which differs from V1 is output from a constant voltage circuit or the like, and thus the constant voltage V2 is applied to the first conductive layer terminal N13 of the semiconductor light receiving element 201. By setting V2 to, for example, 0.8 V in this period, the incidence of light on the semiconductor light receiving element 201 from above causes output of the photocurrent Iphr from the third conductive layer terminal N23 having the spectral sensitivity at the bias condition Vsn=0.8 V in FIG. 3. The photocurrent Iphr output from the semiconductor light receiving element 201 is supplied to the inverting input terminal of the differential amplifier 242 which is included in the current-voltage conversion circuit 241, and is converted into a voltage based on the product of the value of the photocurrent Iphr and the resistance value of the resistor Rf201. The voltage obtained by the conversion is output to the voltage storage circuit 243.

The voltage output from the current-voltage conversion circuit 241 in the second period T2 is stored in the capacitor C202 of the voltage storage circuit 243. To achieve this, in the second period T2, the output terminal of the current-voltage conversion circuit 241 is connected to only one of the terminals of the capacitor C202 by switching on the switch S203 of the voltage storage circuit 243 and switching off the other switches S202, S204, and S205.

Subsequently, in the third period T3, the voltage stored in the capacitor C201 based on the photocurrent Iphf and the voltage stored in the capacitor C202 based on the photocurrent Iphr are output to a differential amplifier circuit 244 by switching off the switches S202 and S203 of the voltage storage circuit 243 and switching on the switches S204 and S205 of the voltage storage circuit 243.

The two voltages output from the voltage storage circuit 243 are compared in the differential amplifier circuit 244, and an output voltage based on a voltage difference between the compared voltages is output from the Out terminal.

Through the circuit operation described above, an output voltage based on a photocurrent of short-wavelength components can be obtained by removing the photocurrent Iphr, which includes long-wavelength components, from the photocurrent Iphf, which includes short-wavelength components and long-wavelength components, where Iphr and Iphf are output from the third conductive layer terminal N23 of the semiconductor light receiving element 201. The output voltage can be obtained at a relatively high sensitivity to light components having a wavelength of 400 nm or less while differential sensitivity is lowered in a wavelength range of 400 nm to 500 nm as indicated in FIG. 4 by the characteristic at the bias condition Vsn=0.4 V.

In the semiconductor light detection device 200 according to the second embodiment, a reduction in chip area is accomplished since only one semiconductor light receiving element and one current-voltage conversion circuit are prepared, whereas two semiconductor light receiving elements and two current-voltage conversion circuits are prepared in the first embodiment. Another effect of processing a plurality of signals with one circuit and one element is that the influence of manufacturing fluctuations is smaller than the case in which a plurality of elements and a plurality of circuits are used.

As in the first embodiment, the current-voltage conversion circuit 241 and the differential amplifier circuit 244 in the second embodiment are not limited to the circuits illustrated in FIG. 6A, and can be circuits of various modes as long as the functions of the circuits 241 and 244 are implemented.

Ultraviolet light included in the sunlight is mainly discussed in the description given above for an example of detecting short-wavelength light components. Further the second embodiment of the present invention is also applicable to the detection of a light component of any wavelength.

Figure 7:
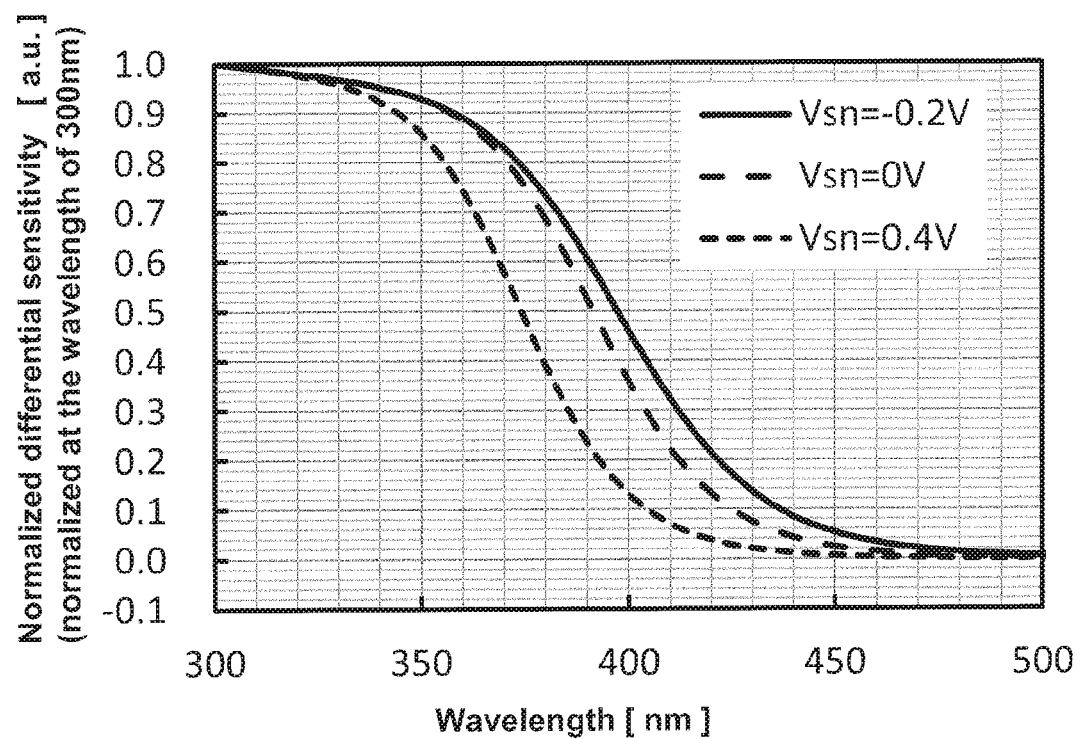
FIG. 7 is a graph for showing differential sensitivity characteristics at different Vsn, and normalized by the sensitivities at a wavelength of 300 nm in a semiconductor light detection device according to the third embodiment of the present invention.

FIG. 7 is a graph of normalized differential sensitivity characteristics in which the differential sensitivity characteristics at the bias condition of Vsn=−0.2 V, 0 V, and 0.4 V in FIG. 4 are separately amplified at suitable magnifications to make an adjustment so that the differential sensitivities coincide at a wavelength of 300 nm or less. The amplification at suitable magnifications does not change the normalized differential sensitivity in the wavelength range of 500 nm or higher because the sensitivity has already been adjusted in FIG. 4 so as to be 0 in the wavelength range of 500 nm or higher. In other words, by performing such conversion processing, a plurality of normalized differential sensitivity characteristics varying in a wavelength range of 300 nm to 500 nm can be obtained, while those differential sensitivities coincide in a wavelength range of 500 nm or higher and in a wavelength range of 300 nm or less. In FIG. 7, for example, subtraction of the normalized differential sensitivity characteristic at Vsn=0 V from the normalized differential sensitivity characteristic at Vsn=−0.2 V produces normalized differential sensitivity characteristic in which the sensitivity to light components having a wavelength of 380 nm to 450 nm is relatively high. A semiconductor light detection device highly sensitive to a light component of any wavelength, not just a wavelength in a wavelength of 380 nm to 450 nm, is further implemented by adopting various values of Vsn.

Figure 8:
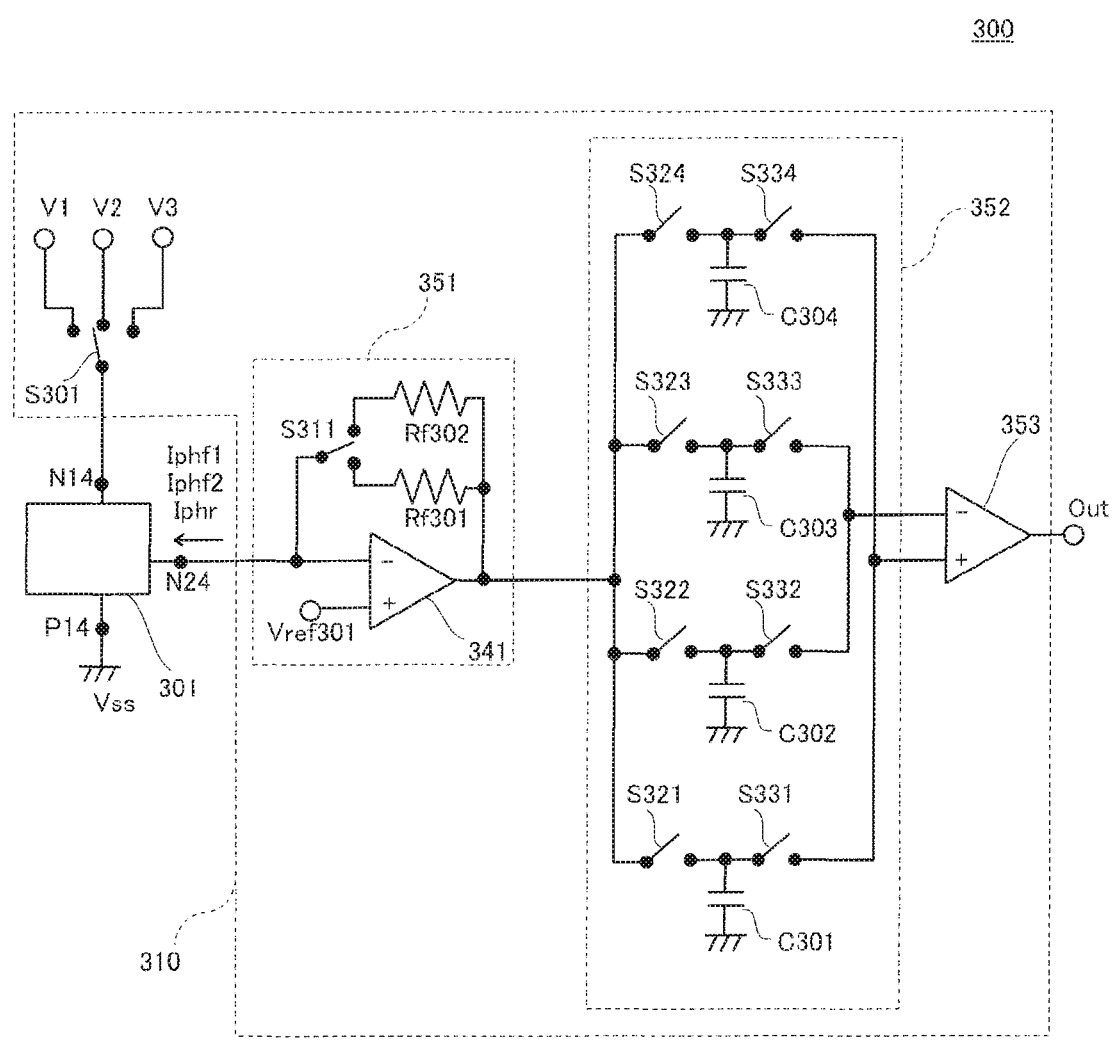
FIG. 8 is a schematic diagram for illustrating a configuration of the semiconductor light detection device according to the third embodiment of the present invention.

FIG. 8 is a diagram for illustrating a third embodiment of the present invention in the form of a schematic circuit diagram of a semiconductor light detection device 300 in which a semiconductor light receiving element 301 similar to the element of FIG. 1 is combined with a semiconductor light detection circuit 310 to detect a light component of a arbitrarily selected specific wavelength.

In FIG. 8, the semiconductor light receiving element 301 in the semiconductor light detection device 300 according to the third embodiment outputs a plurality of photocurrents Iphf and Iphr caused by the incident light in a plurality of periods. The semiconductor light detection circuit 310 outputs, from an Out terminal, an output voltage based on the intensity of the light component having an arbitrarily selected specific wavelength in the incident light, by referring to the plurality of photocurrents, Iphf and Iphr.

The semiconductor light receiving element 301 includes the first conductive layer terminal N14, the second conductive layer terminal P14, and the third conductive layer terminal N24. The first conductive layer terminal N14, the second conductive layer terminal P14, and the third conductive layer terminal N24 correspond to the terminals N1, P1, and N2, respectively, in FIG. 1. Selected one of the three constant voltages V1, V2, and V3 is supplied to the first conductive layer terminal N14 of the semiconductor light receiving element 301 via a switch S301. The second conductive layer terminal P14 in this case is connected to the Vss terminal which has the lowest electric potential in the circuit.

A current-voltage conversion circuit 351 includes a differential amplifier 341, a resistor Rf301, a resistor Rf302, and a switch S311. The resistor Rf301 and the resistor Rf302 are connected at one end to output of the differential amplifier 341, and are connected at the other end to an inverting input terminal of the differential amplifier 341 via the switch S311. The switch S311 connects the inverting input terminal of the differential amplifier 341 to one end of one of the resistor Rf301 and the resistor Rf302. When the switch S311 is connected to the resistor Rf301 side, the current-voltage conversion circuit 351 converts an input current into a voltage based on the product of the current value and the resistance value of the resistor Rf301, and outputs the voltage. When the switch S311 is connected to the resistor Rf302 side, the current-voltage conversion circuit 351 converts an input current into a voltage based on the product of the current value and the resistance value of the resistor Rf302, and outputs the voltage. In short, the current-voltage conversion circuit 351 is a circuit capable of switching to one current-voltage conversion ratio that is selected from a plurality of current-voltage conversion ratios with the switch S311.

A voltage storage circuit 352 includes capacitors C301, C302, C303, and C304, and switches S321, S322, S323, S324, S331, S332, S333, and S334. The voltage storage circuit 352 separately stores, in the capacitors C301, C302, C303, and C304, different voltages input in any period, and then outputs an average voltage of the voltages stored in the capacitors C301 and C304, and outputs an average voltage of the voltages stored in the capacitor C302 and C303.

Figure 9:
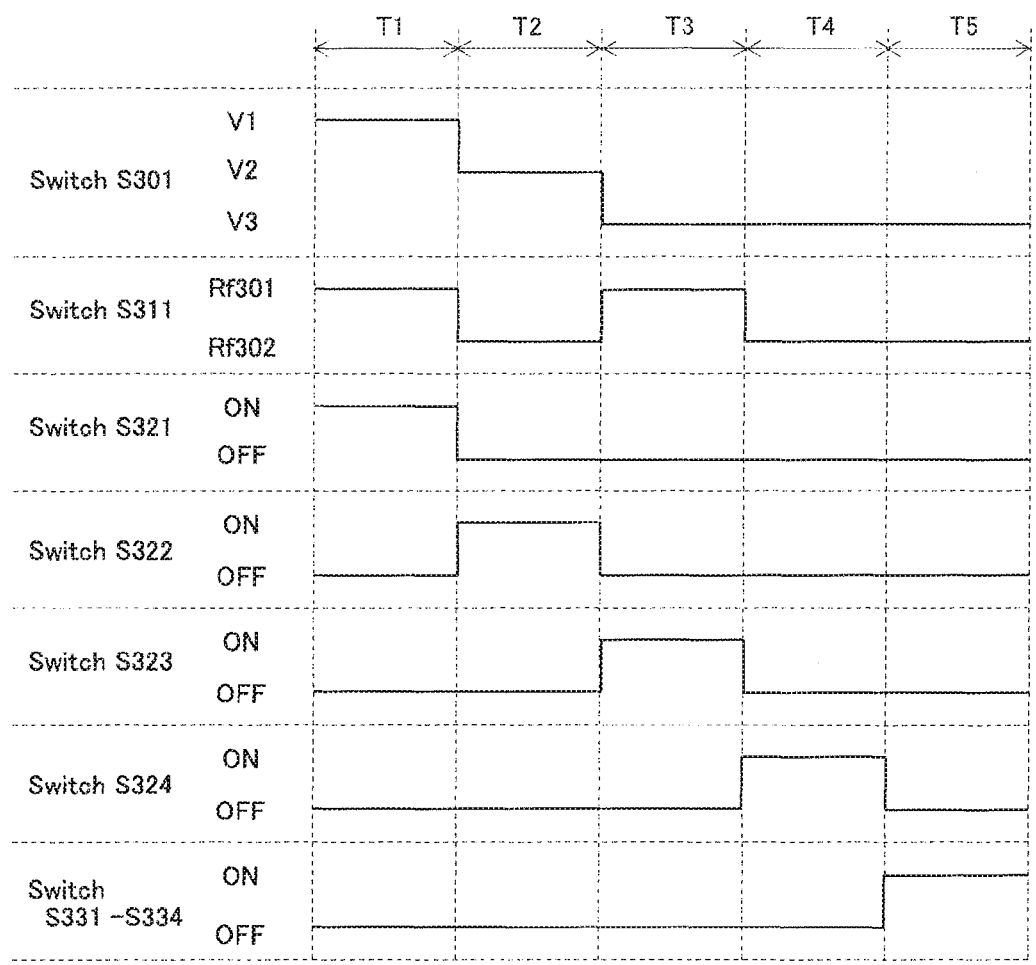
FIG. 9 is a timing chart of signal processing of a semiconductor light detection circuit in the third embodiment of the present invention.

A light detection method using the semiconductor light detection device 300 according to the third embodiment is described with reference to a timing chart of FIG. 9.

In the first period T1, the switch S301 is connected to a terminal side to which the constant voltage V1 from a constant voltage circuit or the like is output, and thus the constant voltage V1 is applied to the first conductive layer terminal N14 of the semiconductor light receiving element 301. By setting V1 to, for example, −0.2 V in this period, the incidence of light on the semiconductor light receiving element 301 from above causes output of the photocurrent Iphf1 from the third conductive layer terminal N24 having the spectral sensitivity at the bias condition Vsn=−0.2 V in FIG. 3.

The photocurrent Iphf1 output from the semiconductor light receiving element 301 is supplied to the inverting input terminal of the differential amplifier 341 which is included in the current-voltage conversion circuit 351. A constant voltage Vref301 which is 0.3 V, for example is applied to a non-inverting input terminal of the differential amplifier 341. The voltage of the third conductive layer terminal N24 of the semiconductor light receiving element 301 is consequently fixed to Vref301. The switch S311 in the current-voltage conversion circuit 351 is connected to the resistor Rf301 side in the first period T1. The current-voltage conversion circuit 351 accordingly outputs a voltage to the voltage storage circuit 352 based on the product of the value of the photocurrent Iphf1, which is output from the semiconductor light receiving element 301, and the resistance value of the resistor Rf301.

The voltage output from the current-voltage conversion circuit 351 in the first period T1 is stored in the capacitor C301 of the voltage storage circuit 352. To achieve this, in the first period T1, an output terminal of the current-voltage conversion circuit 351 is connected to only one of the terminals of the capacitor C301 by switching on the switch S321 of the voltage storage circuit 352 and switching off the other switches S322, S323, S324, S331, S332, S333, and S334.

Subsequently, in the second period T2, the switch S301 is connected to a terminal side to which the constant voltage V2 which differs from V1 is output from a constant voltage circuit or the like, and thus the constant voltage V2 is applied to the first conductive layer terminal N14 of the semiconductor light receiving element 301. By setting V2 to, for example, 0 V in this period, the incidence of light on the semiconductor light receiving element 301 from above causes output of the photocurrent Iphf2 from the third conductive layer terminal N24 having the spectral sensitivity at the bias condition Vsn=0 V in FIG. 3.

The photocurrent Iphf2 output from the semiconductor light receiving element 301 is supplied to the inverting input terminal of the differential amplifier 341 which is included in the current-voltage conversion circuit 351. The switch S311 in the current-voltage conversion circuit 351 is connected to the resistor Rf302 side in the second period T2. The current-voltage conversion circuit 351 accordingly outputs a voltage to the voltage storage circuit 352 based on the product of the value of the photocurrent Iph2, which is output from the semiconductor light receiving element 301, and the resistance value of the resistor Rf302.

The voltage output from the current-voltage conversion circuit 351 in the second period T2 is stored in the capacitor C302 of the voltage storage circuit 352. To achieve this, in the second period T2, the output terminal of the current-voltage conversion circuit 351 is connected to only one of the terminals of the capacitor C302 by switching on the switch S322 of the voltage storage circuit 352 and switching off the other switches S321, S323, S324, S331, S332, S333, and S334.

Subsequently, in the third period T3, the switch S301 is connected to a terminal side to which the constant voltage V3 which differs from V1 and V2 is output from a constant voltage circuit or the like, and thus the constant voltage V3 is applied to the first conductive layer terminal N14 of the semiconductor light receiving element 301. By setting V3 to, for example, 0.8 V in this period, the incidence of light on the semiconductor light receiving element 301 from above causes the photocurrent Iphr to be output from the third conductive layer terminal N24 having the spectral sensitivity at the bias condition Vsn=0.8 V in FIG. 3.

The photocurrent Iphr output from the semiconductor light receiving element 301 is supplied to the inverting input terminal of the differential amplifier 341 which is included in the current-voltage conversion circuit 351. The switch S311 in the current-voltage conversion circuit 351 is connected to the resistor Rf301 side in the third period T3. The current-voltage conversion circuit 351 accordingly outputs a voltage to the voltage storage circuit 352 based on the product of the value of the photocurrent Iphr, which is output from the semiconductor light receiving element 301, and the resistance value of the resistor Rf301.

The voltage output from the current-voltage conversion circuit 351 in the third period T3 is stored in the capacitor C303 of the voltage storage circuit 352. To achieve this, in the third period T3, an output terminal of the current-voltage conversion circuit 351 is connected to only one of the terminals of the capacitor C303 by switching on the switch S323 of the voltage storage circuit 352 and switching off the other switches S321, S322, S324, S331, S332, S333, and S334.

Subsequently, in the fourth period T4, the switch S301 is connected to a terminal side to which the constant voltage V3 is output as in the third period T3, and thus the constant voltage V3 is applied to the first conductive layer terminal N14 of the semiconductor light receiving element 301. Light entering the semiconductor light receiving element 301 from above in this period causes output of the photocurrent Iphr from the third conductive layer terminal N24 having the spectral sensitivity at the bias condition Vsn=0.8 V in FIG. 3 as in the third period T3.

The photocurrent Iphr output from the semiconductor light receiving element 301 is supplied to the inverting input terminal of the differential amplifier 341 which is included in the current-voltage conversion circuit 351. The switch S311 in the current-voltage conversion circuit 351 is connected to the resistor Rf302 side in the fourth period T4. The current-voltage conversion circuit 351 accordingly outputs a voltage to the voltage storage circuit 352 based the product of the value of the photocurrent Iphr, which is output from the semiconductor light receiving element 301, and the resistance value of the resistor Rf302.

The voltage output from the current-voltage conversion circuit 351 in the fourth period T4 is stored in the capacitor C304 of the voltage storage circuit 352. To achieve this, in the fourth period T4, an output terminal of the current-voltage conversion circuit 351 is connected to only one of the terminals of the capacitor C304 by switching on the switch S324 of the voltage storage circuit 352 and switching off the other switches S321, S322, S323, S331, S332, S333, and S334.

Subsequently, in the fifth period T5, the voltages output from the voltage storage circuit 352 are supplied to a differential amplifier circuit 353 which then outputs from the Out terminal, a voltage based on the intensity of a light component of an arbitrarily selected specific wavelength. Voltages $V_{C301}$, $V_{C302}$, $V_{C303}$, and $V_{C304}$ stored in the capacitors C301, C302, C303, and C304, respectively, from the first period T1 to the fourth period T4 have values expressed by equations given below.

$$V_{C301} = Iphf1 \times Rf301 + Vref301$$

$$V_{C302} = Iphf2 \times Rf302 + Vref301$$

$$V_{C303} = Iphr \times Rf301 + Vref301$$

$$V_{C304} = Iphr \times Rf302 + Vref301$$

In the fifth period T5, the voltages in the capacitors C301, C302, C303, and C304 are output to the differential amplifier circuit 353 by switching off the switches S321, S322, S323, and S324 of the voltage storage circuit 352, and switching on the switches S331, S332, S333, and S334 of the voltage storage circuit 352. At this point, the capacitor C301 and the capacitor C304 are connected in parallel, and a combined voltage Va expressed by the following equation is supplied to a non-inverting input terminal of the differential amplifier circuit 353. The capacitors C301, C302, C303, and C304 here all have the same capacitance value C.

$$Va = \{(Iphf1 \times Rf301) \cdot C + (Iphr \times Rf302) \cdot C\}/2C + Vref301$$

The capacitor C302 and the capacitor C303 are also connected in parallel, and a combined voltage Vb expressed by the following equation is supplied to an inverting input terminal of the differential amplifier circuit 353.

$$Vb=\{(Iphf2 \times Rf302) \cdot C + (Iphr \times Rf301) \cdot C\}/2C + Vref301$$

The differential amplifier circuit 353 is a circuit that amplifies a voltage difference between the voltage input to the non-inverting input terminal and the voltage input to the inverting input terminal, and outputs the amplified voltage difference. In other words, an output voltage Vout expressed as follows is output from the Out terminal of FIG. 8.

$$Vout \propto Va - Vb = Rf301 \cdot (Iphf1 - Iphr) - Rf302 \cdot (Iphf2 - Iphr)$$

The subtraction "Iphf1−Iphr" in the equation given above is the subtraction of a photocurrent that is based on the spectral sensitivity characteristic at Vsn=0.8 V in FIG. 3 from a photocurrent that is based on the spectral sensitivity characteristic at Vsn=−0.2 V in FIG. 3. In other words, this represents a photocurrent based on the differential sensitivity characteristic at Vsn=−0.2 V in FIG. 4. Similarly, the subtraction "Iphf2−Iphr" in the equation given above is the subtraction of a photocurrent that is based on the spectral sensitivity characteristic at Vsn=0.8 V in FIG. 3 from a photocurrent that is based on the spectral sensitivity characteristic at Vsn=0 V in FIG. 3, and represents a photocurrent that is based on the differential sensitivity characteristic at Vsn=0 V in FIG. 4.

The multiplication "Rf301·(Iphf1−Iphr)" represents the amplification of the differential sensitivity at Vsn=−0.2 V in FIG. 4, at a specific magnification, and, with an appropriate resistance value chosen for Rf301, matches a photocurrent that is based on the normalized differential sensitivity characteristic at Vsn=−0.2 V in FIG. 7. With an appropriate resistance value chosen for Rf302, the value of Rf302·(Iphf2−Iphr) also matches a photocurrent that is based on the normalized differential sensitivity characteristic at Vsn=0 V in FIG. 7.

The voltage Vout is a voltage based on a difference between the normalized differential sensitivity characteristic at Vsn=−0.2 V in FIG. 7 and the normalized differential sensitivity characteristic at Vsn=0 V in FIG. 7 because a difference between Rf301·(Iphf1−Iphr) and Rf302·(Iphf2−Iphr) is calculated. In short, an output voltage can be obtained at a relatively high sensitivity to light components having a wavelength of 380 nm to 450 nm by this method.

According to the third embodiment, an output voltage can be obtained at a relatively high sensitivity to light components in an arbitrarily selected specific wavelength range, not just light components in a wavelength range of 380 nm to 450 nm, by grasping spectral characteristics of incident light in advance and by selecting an appropriate input voltage and an appropriate amplification resistance value that are associated with spectral characteristics at an upper limit wavelength and a lower limit wavelength.

Further, in the semiconductor light detection device 300 according to the third embodiment, only one semiconductor light receiving element and one current-voltage conversion circuit are required to be prepared, whereas two semiconductor light receiving elements and two current-voltage conversion circuits are prepared in the first embodiment. The semiconductor light detection device 300 accordingly has an effect in that a reduction in chip area is accomplished. Another effect of processing a plurality of signals with one circuit and one element is that the influence of manufacturing fluctuations is smaller than the case that a plurality of elements and a plurality of circuits are used.

As in the first and second embodiments, the current-voltage conversion circuit 351 and the differential amplifier circuit 353 in the third embodiment are not limited to the circuits illustrated in FIG. 8, and can be circuits of various modes as long as the functions of the circuits 351 and 353 are implemented.

The three specific embodiments of the present invention have been described above, but the present invention is not limited to the above-mentioned embodiments, and it is to be understood that various modifications can be made thereto without departing from the gist of the present invention.

For instance, while the semiconductor substrate used in the embodiments of the present invention is a p-type silicon substrate, an n-type silicon substrate may be used, and in this case, the polarities of the layers used in the semiconductor light receiving element 1 of FIG. 1 are switched accordingly. To give another example, the effect of the present invention obtained when the voltage applied to the first conductive layer 16 is changed as in the embodiments described above can be obtained also when the voltage applied to the second conductive layer 15 is changed because the change varies the voltage applied to the p-n junction between the second conductive layer 15 and the first conductive layer 16. The present invention is also not limited to the circuits illustrated in the drawings and described in the embodiments, or to any particular circuits, and other circuits can be used as long as the functions of the described circuits are implemented.

What is claimed is:

1. A semiconductor light detection device, comprising:
a semiconductor light receiving element comprising:
   a first conductive layer having a first conductivity type on a surface of a semiconductor substrate;
   a first conductive layer terminal connected to the first conductive layer;
   a second conductive layer having a second conductivity type below the first conductive layer;
   a second conductive layer terminal connected to the second conductive layer;
   a third conductive layer having the first conductivity type below the second conductive layer; and
   a third conductive layer terminal connected to the third conductive layer;
wherein the semiconductor light receiving element is configured to:
   during a first time period, output, from the third conductive layer via the third conductive layer terminal, a first photocurrent based on an intensity of an incident light irradiating the first conductive layer from above while a first input voltage is applied to the first conductive layer via the first conductive layer terminal during the first time period; and
   during a second time period different from the first time period, output, from the third conductive layer via the third conductive layer terminal, a second photocurrent based on the intensity of the incident light irradiating the first conductive layer from above while a second input voltage is applied to the first conductive layer via the first conductive layer terminal during the second time period;
wherein either or both of the first photocurrent and the second photocurrent contains a part of photocurrent generated in a junction of the first conductive layer and the second conductive layer; and
a semiconductor light detection circuit coupled to the third conductive layer terminal and configured to:
   receive the first photocurrent and the second photocurrent from the third conductive layer terminal; and
   output an output voltage corresponding to a current difference between the first photocurrent and the second photocurrent the semiconductor light detection circuit configured to directly compare a first value corresponding to the first photocurrent and a second value corresponding to the second photocurrent to determine the current difference between the first photocurrent and the second photocurrent.

2. The semiconductor light detection device according to claim 1, wherein the semiconductor light detection circuit includes:
a switch configured to select one input voltage out of the first input voltage and the second input voltage to apply the selected one input voltage to the first conductive layer of the semiconductor light receiving element;
a current-voltage conversion circuit configured to selectively convert one of the first photocurrent and the second photocurrent, being output from the semiconductor light receiving element, into one of a first conversion voltage based on the first photocurrent, and a second conversion voltage based on the second photocurrent, and output the one of the first conversion voltage and the second conversion voltage;
a voltage storage circuit configured to store the first conversion voltage output from the current-voltage conversion circuit in a first capacitor as a first stored voltage, store the second conversion voltage in a second capacitor as a second stored voltage, and output the first stored voltage and the second stored voltage; and
a differential amplification circuit configured to output a voltage based on a difference between the first stored voltage and the second stored voltage, output from the voltage storage circuit.

3. The semiconductor light detection device according to claim 1, wherein the first input voltage and the second input voltage include one of a reverse voltage or a forward voltage of 0.4 V or less in a p-n junction between the first conductive layer and the second conductive layer.

4. The semiconductor light detection device according to claim 1, wherein the semiconductor substrate includes silicon as a material.

5. A method, comprising:
during a first time period, outputting, from a third conductive layer of a semiconductor light receiving element via a third conductive layer terminal, a first photocurrent based on an intensity of an incident light irradiating a first conductive layer from above while a first input voltage is applied to the first conductive layer via a first conductive layer terminal during the first time period; and
during a second time period different from the first time period, outputting, from the third conductive layer via the third conductive layer terminal, a second photocurrent based on the intensity of the incident light irradiating the first conductive layer from above while a second input voltage is applied to the first conductive layer via the first conductive layer terminal during the second time period;
wherein the semiconductor light receiving element includes:
the first conductive layer having a first conductivity type on a surface of a semiconductor substrate;
the first conductive layer terminal connected to the first conductive layer;
a second conductive layer having a second conductivity type below the first conductive layer;
a second conductive layer terminal connected to the second conductive layer;
the third conductive layer having the first conductivity type below the second conductive layer; and
the third conductive layer terminal connected to the third conductive layer;
wherein either or both of the first photocurrent and the second photocurrent contains a part of photocurrent generated in a junction of the first conductive layer and the second conductive layer;
the method further comprising:
receiving, by a semiconductor light detection circuit coupled to the third conductive layer terminal, the first photocurrent and the second photocurrent from the third conductive layer terminal;
directly comparing, by the semiconductor light detection circuit, a first value corresponding to the first photocurrent and a second value corresponding to the second photocurrent to determine a current difference between the first photocurrent and the second photocurrent; and
outputting, by the semiconductor light detection circuit, an output voltage corresponding to the current difference between the first photocurrent and the second photocurrent.

6. The method according to claim 5, further comprising:
wherein the semiconductor light detection circuit includes:
selecting, by a switch of the semiconductor light detection circuit, one input voltage out of the first input voltage and the second input voltage to apply the selected one input voltage to the first conductive layer of the semiconductor light receiving element;
selectively converting, by a current-voltage conversion circuit of the semiconductor light detection circuit, one of the first photocurrent and the second photocurrent being output from the semiconductor light receiving element into one of a first conversion voltage based on the first photocurrent and a second conversion voltage based on the second photocurrent, and outputting the one of the first conversion voltage and the second conversion voltage;
storing, by a voltage storage circuit of the semiconductor light detection circuit, the first conversion voltage output from the current-voltage conversion circuit in a first capacitor as a first stored voltage, storing the second conversion voltage in a second capacitor as a second stored voltage, and outputting the first stored voltage and the second stored voltage; and
outputting, by a differential amplification circuit of the semiconductor light detection circuit, a voltage based on a difference between the first stored voltage and the second stored voltage, output from the voltage storage circuit.

7. The method according to claim 5, wherein the first input voltage and the second input voltage include one of a reverse voltage or a forward voltage of 0.4 V or less in a p-n junction between the first conductive layer and the second conductive layer.

8. The method according to claim 5, wherein the semiconductor substrate includes silicon as a material.

* * * * *